US009935261B1

(12) United States Patent  
Patel et al.

(10) Patent No.: US 9,935,261 B1  
(45) Date of Patent: Apr. 3, 2018

(54) DIELECTRIC ENCAPSULATION LAYER FOR MAGNETIC TUNNEL JUNCTION (MTJ) DEVICES USING RADIO FREQUENCY (RF) SPUTTERING

(71) Applicant: Headway Technologies, Inc., Milpitas, CA (US)

(72) Inventors: Sahil Patel, Fremont, CA (US); Ru-Ying Tong, Los Gatos, CA (US); Dongna Shen, San Jose, CA (US); Yu-Jen Wang, San Jose, CA (US); Vignesh Sundar, Sunnyvale, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/479,522

(22) Filed: Apr. 5, 2017

(51) Int. Cl.
*G11B 5/33* (2006.01)
*H01L 43/08* (2006.01)
*H01L 43/12* (2006.01)
*H01L 43/02* (2006.01)
*H01L 27/22* (2006.01)

(52) U.S. Cl.
CPC .......... *H01L 43/08* (2013.01); *H01L 27/222* (2013.01); *H01L 43/02* (2013.01); *H01L 43/12* (2013.01)

(58) Field of Classification Search
CPC .............. H04L 25/05; H04N 1/00339; H04N 21/42661
See application file for complete search history.

(56) References Cited

U.S. PATENT DOCUMENTS

| | | | |
|---|---|---|---|
| 7,009,266 | B2 | 3/2006 | Shi et al. |
| 7,978,442 | B2 | 7/2011 | Zhang et al. |
| 8,203,389 | B1 | 6/2012 | Zhou et al. |
| 8,270,112 | B2 | 9/2012 | Funayama et al. |
| 8,455,965 | B2 | 6/2013 | Li et al. |

(Continued)

OTHER PUBLICATIONS

"Microwave Assisted Magnetic Recording," by Jian-Gang Zhu, et al., IEEE Transactions on Magnetics, vol. 44, No. 1, Jan. 2008, pp. 125-131.

(Continued)

*Primary Examiner* — Zandra Smith  
*Assistant Examiner* — André C Stevenson  
(74) *Attorney, Agent, or Firm* — Saile Ackerman LLC; Stephen B. Ackerman

(57) ABSTRACT

A magnetic device for magnetic random access memory (MRAM), spin torque MRAM, or spin torque oscillator technology is disclosed wherein a perpendicularly magnetized magnetic tunnel junction (p-MTJ) with a sidewall is formed between a bottom electrode and a top electrode. A first dielectric layer is 3 to 400 Angstroms thick, and formed on the p-MTJ sidewall with a physical vapor deposition RF sputtering process to establish a thermally stable interface with the p-MTJ up to temperatures around 400° C. during CMOS fabrication. The first dielectric layer may comprise one or more of B, Ge, and alloys thereof, and an oxide, nitride, carbide, oxynitride, or carbonitride. The second dielectric layer is up to 2000 Angstroms thick and may be one or more of $SiO_yN_z$, $AlO_yN_z$, $TiO_yN_z$, $SiC_yN_z$, or MgO where y+z>0.

24 Claims, 5 Drawing Sheets

(56) References Cited

U.S. PATENT DOCUMENTS

| | | |
|---|---|---|
| 8,482,966 B2 | 7/2013 | Kang et al. |
| 8,582,240 B1 | 11/2013 | Chen et al. |
| 8,604,886 B2 | 12/2013 | Nikonov et al. |
| 9,081,669 B2 | 7/2015 | Tadepalli et al. |
| 9,230,571 B1 | 1/2016 | Chen et al. |
| 9,281,168 B2 | 3/2016 | Mudivarthi et al. |
| 9,324,937 B1 | 4/2016 | Annunziata et al. |
| 9,373,500 B2 | 6/2016 | Swaminathan et al. |
| 2012/0292723 A1 | 11/2012 | Luo et al. |
| 2014/0037836 A1* | 2/2014 | Kunliang ............... B82Y 10/00 427/130 |
| 2016/0372658 A1 | 12/2016 | Hu et al. |

OTHER PUBLICATIONS

"Spin-Torque Oscillator Based on Magnetic Tunnel Junction with a Perpendicularly Magnetized Free Layer and In-Plane Magnetized Polarizer," by Hitoshi Kubota, et al., 2013 The Japan Society of Applied Physics, Applied Physics Express 6 (2013) 103003, Sep. 27, 2013, pp. 1-3.

"High-Power Coherent Microwave Emission from Magnetic Tunnel Junction Nano-oscillators with Perpendicular Anisotropy," by Zhongming Zeng, et al, 2012 American Chemical Society, Jun. 4, 2012, vol. 6, No. 7, pp. 6115-6121.

"Current-driven excitation of magnetic multilayers," by J.C. Slonczweski, Journal of Magnetism and Mangetic Materials, vol. 159, Issues 1-2, Jun. 1996, pp. L1-L7.

\* cited by examiner

DIELECTRIC ENCAPSULATION LAYER FOR MAGNETIC TUNNEL JUNCTION (MTJ) DEVICES USING RADIO FREQUENCY (RF) SPUTTERING

RELATED PATENT APPLICATIONS

This application is related to the following: U.S. Pat. No. 9,230,571; and U.S. Ser. No. 15/463,113, filed on Mar. 20, 2017; assigned to a common assignee, and herein incorporated by reference in their entirety.

TECHNICAL FIELD

The present disclosure relates to magnetic tunnel junctions (MTJs) in magnetic random access memory (MRAM), spin-torque MRAM, and other spintronic devices, and in particular to protecting MTJ sidewalls during processing steps including the deposition of an insulating dielectric layer that separates adjacent MTJs, and during high temperature annealing around 400° C. that is common in Complementary Metal Oxide Semiconductor (CMOS) fabrication.

BACKGROUND

A MTJ is a key component in MRAM, spin-torque MRAM, and other spintronic devices and comprises a stack with a tunnel barrier layer such as a metal oxide formed between two magnetic layers that provides a tunneling magnetoresistance (TMR) effect. Since MTJ elements are often integrated in CMOS devices, the MTJ must be thermally stable in order to withstand annealing temperatures around 400° C. for up to several hours that are commonly applied to improve the quality of the CMOS units for semiconductor purposes.

Perpendicularly magnetized MTJs (p-MTJs) wherein the free layer (FL) and reference layer (RL) have perpendicular magnetic anisotropy (PMA) are preferred over their counterparts that employ in-plane anisotropy because a p-MTJ has an advantage in a lower writing current for the same thermal stability, and better scalability. P-MTJs are a major emerging technology for use in embedded magnetic random access memory (MRAM) applications including spin torque (STT) MRAM, and in standalone MRAM applications. STT-MRAM, which uses spin-torque for writing of memory bits, was described by C. Slonezewski in "Current driven excitation of magnetic multilayers", J. Magn. Magn. Mater. V 159, L1-L7 (1996), and is highly competitive with existing semiconductor memory technologies such as SRAM, DRAM, and flash.

P-MTJs have a general structure where an insulating tunnel barrier is sandwiched between two magnetic layers. One of the magnetic layers is called the reference layer and has a magnetization fixed in an out-of-plane direction in the (+y) direction, for example. The second magnetic layer called the free layer has a magnetization that is also "out-of-plane", but may be switched from a (+y) direction in a parallel or P state to a (−y) direction in an anti-parallel or AP state, or vice versa. When a current is passed through the p-MTJ in a perpendicular to plane direction, the different in resistance between the P state (Rp) and AP state (Rap) can be characterized by the equation (Rap-Rp)/Rp that is also known as DRR or the magnetoresistive (MR) ratio. It is important for p-MTJ devices to have a large DRR value since this property is directly related to the read margin for the memory bit, or the ease of differentiating between the P state (0 bit) and AP state (1 bit).

Spin-torque (STT)-MRAM based technologies are desirable for nonvolatile memory applications. However, to compete with high speed embedded SRAM technologies, p-MTJs must be fabricated into high density arrays with single bits that can be written at high speed (<100 ns) at low writing currents. To achieve the goal of low writing currents, total volume in the free layer must be reduced, which is most easily achieved by reducing the physical dimensions of the p-MTJ. However, as the physical dimensions decrease, the effect of current conductance through "edge" or sidewall regions of the p-MTJ device becomes more pronounced. P-MTJs are highly susceptible to sidewall damage, both chemical and physical, induced by etching and deposition processes, and exacerbated by the CMOS process requirement of annealing at 400° C. Accordingly, these edge regions are of particular importance as crystal structure damage from etching, encapsulation, and annealing processes may greatly affect p-MTJ properties including free layer coercivity (Hc), DRR, and resistance-area product (RA).

Typically, encapsulation with a dielectric layer is used to isolate p-MTJ devices from one another in a STT-MRAM array. The dielectric layer is deposited with a chemical vapor deposition (CVD), plasma enhanced CVD (PECVD), atomic layer deposition (ALD), or reactive dc-sputtering physical vapor deposition (PVD) method that involves reactive gases, radicals, ions, or other excited species having a tendency to attack p-MTJ sidewalls and damage the magnetic layers therein. Sidewall damage leads to a reduction in device performance, substantial non-uniformity between bits that translates into an undesirable larger distribution of key metrics, and lower device yields. It is important for the encapsulation layer to form a thermodynamically stable interface with p-MTJ sidewalls to prevent oxygen diffusion through a p-MTJ sidewall during an oxide dielectric layer deposition, for example, or intermixing of the dielectric layer with one or more p-MTJ layers that also results in degradation of device performance.

Although methods are available to remove sidewall damage caused by ion bombardment, and by exposure to atmosphere during dielectric layer deposition, the methods are generally time consuming and costly. Moreover, some p-MTJ sidewall damage may be too extensive to repair. There is a need to improve the encapsulation process to prevent parallel conduction along p-MTJ sidewalls, and avoid damage to the device by depositing an encapsulation layer, which will form a thermodynamically stable interface with the p-MTJ and increase DRR.

SUMMARY

One objective of the present disclosure is to substantially improve the resistance of a p-MTJ to sidewall damage during encapsulation, and annealing processes in memory device fabrication thereby improving DRR and device yield.

A second objective of the present disclosure is to provide a better method of encapsulating a p-MTJ device that enables thermal stability up to 400° C. in order to be compatible with back end of line (BEOL) CMOS processes.

According to one embodiment of the present disclosure, these objectives are achieved with a two step encapsulation process in which the first step comprises depositing a first dielectric layer on a p-MTJ sidewall by a PVD method wherein a first dielectric material is RF sputtered using inert gas. A key feature is that a RF sputtering process is employed with conditions that localize ionized species in the plasma to a region around the target cathode using inert process gases so that reactive species do not attack the p-MTJ sidewall. During the first step, the p-MTJ sidewall is entirely covered and forms a thermodynamically stable interface with the first dielectric layer. The first dielectric layer may have a bilayer configuration with a lower layer contacting the p-MTJ sidewall and an upper layer with a top surface. Thereafter, a second dielectric layer is deposited on the top surface of the first dielectric layer by a PVD, PECVD, or CVD process wherein reactive gases, plasmas, or radicals may impinge on the first dielectric layer but do not reach the p-MTJ sidewall. The second dielectric layer is preferably thicker than the first dielectric layer to ensure that openings between adjacent p-MTJs are completely filled.

According to one embodiment, the first dielectric layer is one of $SiO_yN_z$, $AlO_yN_z$, $TiO_yN_z$, $SiC_yN_z$, or MgO, or any combination of the aforementioned materials where $y+z>0$. In other embodiments, the first dielectric layer may comprise BX or GeX where X is O, N, B, C, Ge, Si, Al, P, Ga, In, Tl, Mg, Hf, Zr, Nb, V, Ti, Cr, Mo, W, Sr, or Zn. In embodiments where the first dielectric layer has a bilayer configuration, a B/BX, Ge/GeX stack may be formed, or the lower layer may be one of B, Ge, BX, or GeX, while the upper layer is one of $SiO_yN_z$, $AlO_yN_z$, $TiO_yN_z$, $SiC_yN_z$, or MgO. In a trilayer configuration, an upper layer made of $SiO_yN_z$, $AlO_yN_z$, $TiO_yN_z$, $SiC_yN_z$, or MgO is formed on a lower layer with a B/BX or Ge/GeX stack.

The second dielectric layer is typically a metal oxide, metal carbide, metal nitride, metal oxynitride, or metal carbonitride having a thickness up to 2000 Angstroms, and may be comprised of $SiO_yN_z$, $AlO_yN_z$, $TiO_yN_z$, $SiC_yN_z$, or MgO where $y+z>0$. The second dielectric layer also serves as an insulation layer to electrically isolate p-MTJs from one another.

In the completed memory structure that may be a MRAM, STT-MRAM, embedded flash, or spin torque oscillator (STO), there is an array of p-MTJ elements formed in a plurality of rows and columns on a substrate. In a MRAM or STT-MRAM application, the substrate comprises a bottom electrode layer wherein there is a plurality of first conductive lines so that a bottom surface of each p-MTJ contacts a first conductive line. Each p-MTJ has a sidewall that is protectively covered by the first dielectric layer while the second dielectric layer is an insulation layer. A top electrode layer comprised of a plurality of second conductive lines is formed on the array of p-MTJ elements such that each p-MTJ is formed between a first conductive line and a second conductive line.

In a STO device, the substrate may be a main pole layer that serves as a bottom electrode, and the top electrode may be a trailing shield, for example. An encapsulation layer formed by a method described herein is formed on a side of the STO stack of layers that faces away from an air-bearing surface (ABS).

DETAILED DESCRIPTION

Figure 1:
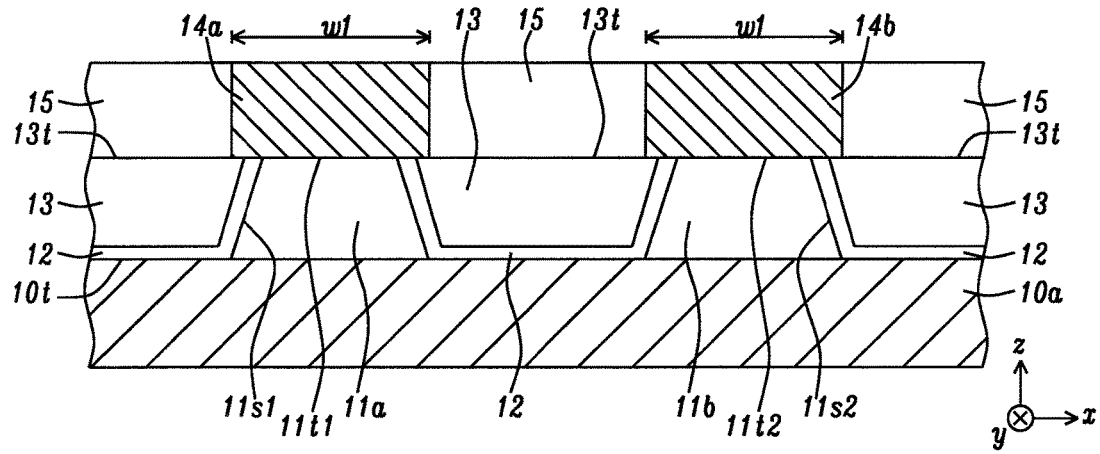
FIG. 1 is a cross-sectional view depicting a memory structure having an encapsulation layer that forms a thermodynamically stable interface with adjoining p-MTJ sidewalls according to an embodiment of the present disclosure.

The present disclosure relates to an improved p-MTJ encapsulation layer and a method for forming the same where an interface is established between the encapsulation layer and p-MTJ sidewalls that is stable to high temperatures around 400° C. The p-MTJ elements may be formed in a variety of memory devices including but not limited to MRAM, e-flash, spin-torque MRAM, and other spintronic devices such as a spin torque oscillator (STO). In the drawings, a thickness of a layer is in the z-axis direction, and a plane or top surface of each p-MTJ layer is laid out in the x-axis and y-axis directions. The terms "dielectric" and "insulation" may be used interchangeably as well as "passivation" and "encapsulation".

As mentioned previously, many memory devices are now incorporated into CMOS platforms in order to provide higher performance. However, we observe substantially more defects and degraded device performance when dielectric layers are deposited directly on p-MTJ sidewalls by conventional methods, and the resulting device is annealed at temperatures around 400° C. that are required in CMOS processing. Thus, we were motivated to implement a means of protecting p-MTJ elements to provide higher performance and yields in memory applications.

In related U.S. application Ser. No. 15/463,113, we disclosed how deposition of passivation layer materials such as B, C, and Ge in the absence of reactive oxygen and nitrogen species is effective in protecting p-MTJ sidewalls from damage during subsequent deposition of a dielectric layer that serves as an insulation layer between p-MTJs. Now we have discovered a process that enables a wide variety of encapsulation layer materials to be formed on a p-MTJ sidewall thereby providing a thermodynamically stable interlace with the sidewall, and improving p-MTJ integrity.

Referring to FIG. 1, a first embodiment of the present disclosure is shown wherein a memory device comprises a plurality of p-MTJs including p-MTJ 11a and p-MTJ 11b that have sidewalls 11s1 and 11s2, respectively, and are protected by first dielectric layer 12. P-MTJ 11a is formed between a bottom electrode 10a and a top electrode 14a while p-MTJ 11b is between bottom electrode 10a and top electrode 14b. Second dielectric layer 13 is formed on the first dielectric layer and fills the gaps between adjacent p-MTJ elements. The stack of first and second dielectric layers is considered to be an encapsulation layer. The bottom electrode is a line that extends along the x-axis, and the top electrodes are lines that extend in the y-axis direction in a MRAM or STT-MRAM embodiment. Bottom and top electrodes are typically comprised of one or more metals or alloys to ensure excellent electrical conductivity and resistance to oxidation. There is an insulation layer 15 formed on a substantial portion of the second dielectric layer top surface 13t. Within the insulation layer is a top electrode layer comprised of a plurality of top electrodes including 14a, 14b. Note that each of the top electrodes may have a width w1 that is greater than a width of p-MTJ top surfaces 11t1, and 11t2. In other words, a substantial portion of each top electrode overlays on a p-MTJ layer 11a or 11 b, and an outer portion is formed on second dielectric layer top surface 13t that is proximate to the first dielectric layer. Portions of bottom electrode top surface 10t coincide with a bottom surface of p-MTJs 11a, 11b.

It should be understood that typically millions of p-MTJs are aligned in rows and columns in a memory array on a substrate, and each p-MTJ is formed between a bottom electrode and a top electrode. However, the number of p-MTJs shown in FIG. 1 is limited to two in order to simplify the drawing. The p-MTJs may have a variety of configurations but each p-MTJ including 11a, 11b has at least a tunnel barrier formed between a reference layer (RL) and free layer (FL) in a RL/tunnel barrier/FL or FL/tunnel barrier/RL stack on a bottommost layer (not shown) that is a seed layer, for example. Preferably, first dielectric layer 12 has a substantially uniform thickness, and contacts not only p-MTJ sidewalls 11s1 and 11s2, and other MTJ sidewalls that are not depicted, but also adjoins portions of top surface 10t of bottom electrode 10a that are not covered by p-MTJs.

According to one embodiment, the first dielectric layer 12 is a single D layer having a thickness of 3 to 400 Angstroms where D is one of $SiO_YN_Z$, $AlO_YN_Z$, $TiO_YN_Z$, $SiC_YN_Z$, or MgO, or any combination of the aforementioned materials where y+z>0. In embodiments where MgO or another metal oxide is co-deposited with a nitride such as $SiN_Z$, for example, the content of the oxide (MgO) is from 0.1 to 10 weight % in the nitride matrix. Although not bound by theory, it is believed that MgO at least partially segregates from the $SiN_Z$ during deposition to form a thin oxide layer at an interface with the p-MTJ sidewall that is more stable than an interface with silicon nitride. However, the present disclosure anticipates the first dielectric layer may comprise other metal oxides, metal carbides, metal nitrides, metal oxynitrides, or metal carbonitrides used in the art. Preferably, the first dielectric layer is amorphous and not crystalline to prevent diffusion of reactive materials between crystals in a lattice structure during subsequent processes.

In another embodiment, the first dielectric layer 12 is a single layer comprising one of B and Ge that includes but is not limited to B, Ge, BX, or GeX where X is one of O, N, B, C, Ge, Si, Al, P, Ga, In, Tl, Mg, Hf, Zr, Nb, V, Ti, Cr, Mo, W, Sr, and Zn, and where X is unequal to the other element in the alloy. It is important that the first dielectric layer is at least 3 Angstroms thick to provide a continuous film on the p-MTJ sidewalls 11s1, 11s2.

In a second embodiment depicted in the intermediate structure shown in FIG. 6, the first dielectric layer 12 has a bilayer configuration wherein a lower layer 12-1 contacts the p-MTJ sidewalls 11s1, 11s2, and an upper layer 12-2 has a top surface on which the second dielectric layer 13 will subsequently be deposited. Typically, there is an opening 50b above the first dielectric layer and between adjacent p-MTJs 11a, 11b before the second dielectric layer is deposited. In some embodiments, the lower layer 12-1 is B or Ge, and upper layer 12-2 is one of BX or GeX. In other embodiments, the lower layer has a B, Ge, BX, or GeX composition while the upper layer is the D layer described previously. The bilayer configuration has a minimum thickness of 3 Angstroms while a maximum thickness for first dielectric layer 12 is 400 Angstroms.

Figure 7:
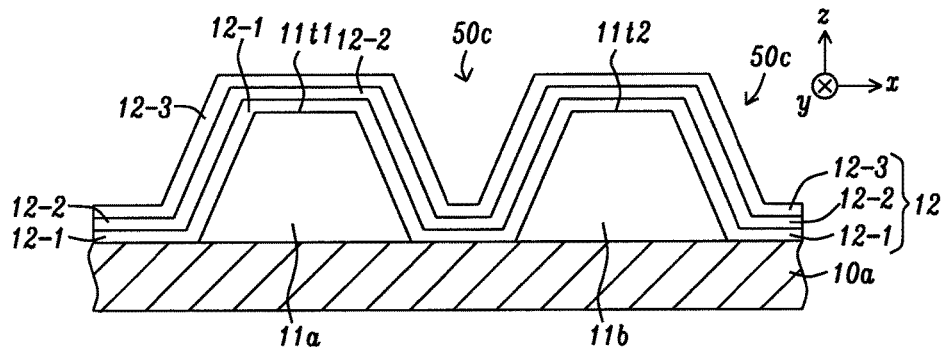
FIG. 7 is a cross-sectional view of an embodiment of the present disclosure where the first dielectric layer has a trilayer configuration.

According to a third embodiment in FIG. 7, the first dielectric layer has a trilayer configuration represented by B/BX/D or Ge/GeX/D where B or Ge is the lower layer 12-1 that contacts p-MTJ sidewalls 11s1, 11s2, and BX or GeX forms a middle layer 12-2 on the lower layer. Upper layer 12-3 has the D layer composition and the second dielectric layer is subsequently deposited thereon. A total thickness of the first dielectric layer 12 is in the range of 3 to 400 Angstroms. Openings 50c are formed above the first dielectric layer and between adjacent p-MTJs.

Returning to FIG. 1, the second dielectric layer 13 is typically a metal oxide, metal carbide, metal nitride, metal oxynitride, or metal carbonitride such as $SiO_YN_Z$, $AlO_YN_Z$, $TiO_YN_Z$, $SiC_YN_Z$, or MgO where y+z>0, or any combination of the aforementioned materials. The second dielectric layer has a thickness up to about 2000 Angstroms and is typically thicker than the first dielectric layer. As explained later, the second dielectric layer usually has a faster deposition rate than the first dielectric layer and is relied on to fill openings between adjacent p-MTJs that remain after the first dielectric layer is formed. A PVD RF sputtering method is employed to deposit the first dielectric layer in order to prevent exposure of p-MTJ sidewalls to reactive gases during deposition of dielectric layers 12, 13. However, the PVD RF sputtering method has a relatively slow deposition rate compared with PECVD or CVD methods. Thus, in order to enhance throughput, the first dielectric layer thickness is limited to a maximum value of about 400 Angstroms to minimize process time.

Figure 2:
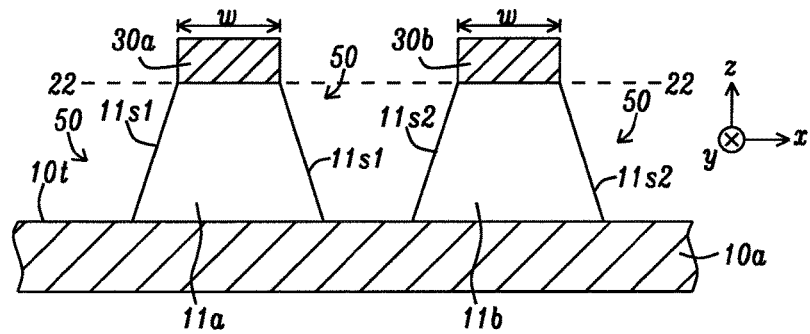
FIG. 2 is a cross-sectional view showing a patterning step that forms a plurality of p-MTJs from a p-MTJ stack of layers according to an embodiment of the present disclosure.

A key feature of the present disclosure is a process sequence for forming the encapsulation layer comprised of dielectric layers 12, 13 on p-MTJ sidewalls. First, a method of fabricating a plurality of p-MTJs is described. In FIG. 2, a p-MTJ stack of layers is formed on a bottom electrode layer that includes bottom electrode 10a. All layers in the MTJ stack may be deposited in a DC sputtering chamber of a sputtering system such as an Anelva C-7100 sputter deposition system that includes ultra high vacuum DC magnetron sputter chambers with multiple targets, and at least one oxidation chamber to form a tunnel barrier such as MgO from a Mg layer, and thereby provide a TMR effect. Typically, the sputter deposition processes for various layers involve an inert gas such as Ar and a base pressure between $5\times10^{-8}$ and $5\times10^{-9}$ torr.

A photoresist layer is formed on the MTJ stack of layers and is patterned by a well known photolithography technique to give a plurality of islands including photoresist islands 30a, 30b each having a width w. Subsequently, a conventional reactive ion etch (RIE) or ion beam etch (IBE)

process is performed to remove regions of the p-MTJ stack of layers that are not protected by a photoresist island. Note that the photolithography process yields an array of photoresist islands laid out in rows and columns such that each island serves as an etch mask, and the RIE or IBE process generates a p-MTJ below each etch mask. Thus, p-MTJs 11a and 11b are formed with sidewalls 11s1 and 11s2, respectively, below islands 30a and 30b, and there are openings 50 on each side of the MTJs that expose portions of bottom electrode top surface 10t. Each p-MTJ has a top surface at plane 22-22. In the exemplary embodiment, the RIE or IBE process forms non-vertical sidewalls 11s1 and 11s2 such that a bottom of each MTJ at top surface 10t has a greater width than w. However, depending on the etch conditions, substantially vertical MTJ sidewalls may be produced such that a width w is established at top and bottom p-MTJ surfaces.

Figure 3:
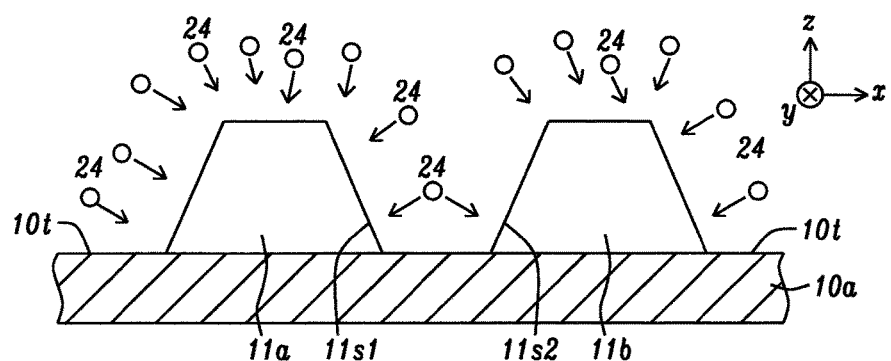
FIGS. 3-4 are cross-sectional views of a PVD process comprised of RF sputtering which forms a first dielectric layer on p-MTJ sidewalls according to an embodiment of the present disclosure.

Referring to FIG. 3, a conventional process is used to remove photoresist islands 30a, 30b. Then, a first deposition step is performed to lay down the first dielectric layer on the array of p-MTJs including p-MTJ 11a and p-MTJ 11b. It is critical that dielectric material species 24 are formed in a PVD process comprising radio frequency (RF) sputtering deposition using a RF magnetron source. Species 24 are directed at an angle >0 degrees with respect to the z-axis thereby ensuring adequate coverage of the resulting first dielectric layer 12 on p-MTJ sidewalls 11s1, 11s2. An inert gas such as Ar, Kr, Ne, or Xe is used for the sputtering process, and PVD RF sputtering conditions are employed such that ionized species from the plasma are localized to the target cathode. In a preferred embodiment, RF power is maintained in the range of 300 to 1500 Watts, with an inert gas pressure of 0.05 to 20 mTorr at room temperature during deposition of the first dielectric layer that may have a D layer composition, or is one of B, Ge, BX, or GeX as described previously.

In an alternative embodiment, the deposition of a BX or GeX layer as the first dielectric layer 12 may comprise two steps as described in related U.S. application Ser. No. 15/463,113. For example, a B or Ge layer may be PVD RF sputter deposited on p-MTJ sidewalls 11s1, 11s2 in a first step. Then, the X layer is PVD RF sputter deposited on the B layer in a second step, and under certain conditions effectively resputters the B or Ge layer to yield a single BX or GeX layer. Moreover, the initially RF sputter deposited B or Ge layer may be subjected to an oxidation such as a natural oxidation, or a nitridation to form a BO or GeO, or a BN or GeN first dielectric layer, respectively.

Figure 4:
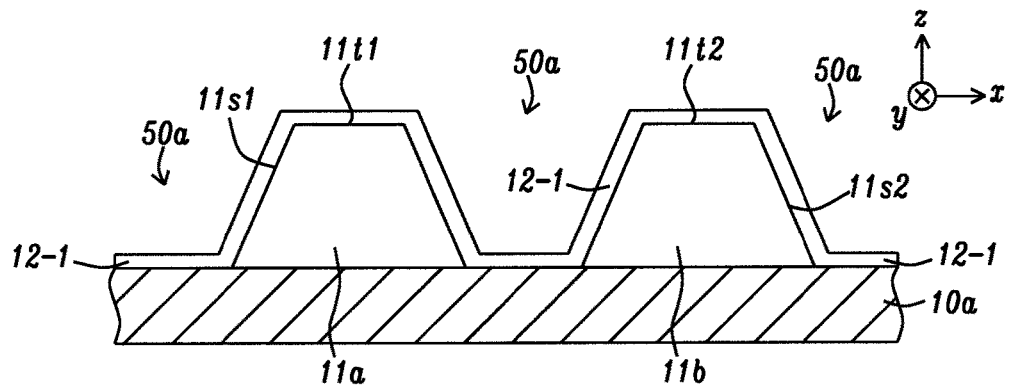

Referring to FIG. 4, each opening 50 (FIG. 2) between adjacent p-MTJs shrinks in size to an opening 50a after the first dielectric layer 12 is deposited. Preferably, there is a substantially uniform thickness of at least 3 Angstroms on top surfaces 11t1, 11t2, and on sidewalls 11s1, 11s2, respectively, of p-MTJ 11a and p-MTJ 11b. As a result of the PVD RF sputtering process, the interface between the p-MTJ sidewalls and the first dielectric layer is thermodynamically stable with essentially no attack or damage on the sidewalls or top surfaces by species 24 in the first embodiment where first dielectric layer 12 in FIG. 1 is a single layer.

The present disclosure also anticipates embodiments where the first dielectric layer has a B/BX or Ge/GX configuration, or a B/D, BX/D, Ge/D, or GeX/D configuration. Accordingly, the aforementioned PVD RF sputter deposition process involving a RF power from 300 to 1500 Watts and inert gas pressure of 0.05 to 20 mTorr may be repeated. In particular, a first PVD RF sputtering step comprises the deposition of a B, Ge, BX, or GeX layer. Then, a second PVD RF sputtering step is used to deposit a D layer on the B, Ge, BX, or GeX layer.

Figure 5:
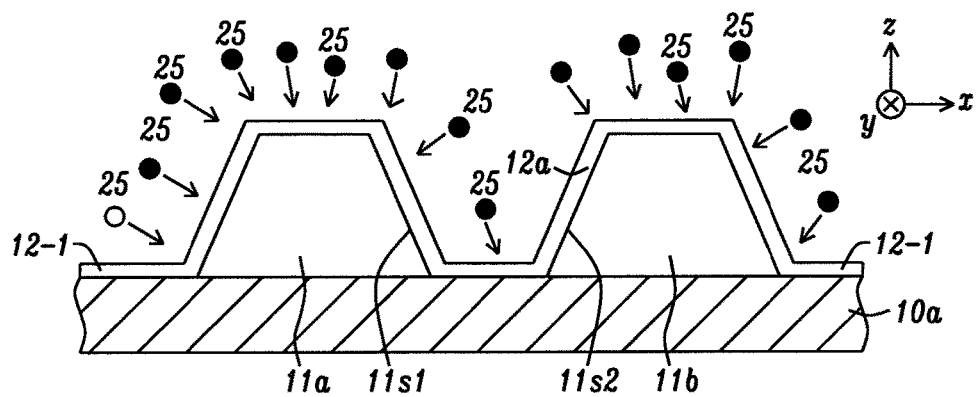
FIGS. 5-6 are cross-sectional views of a process where an upper dielectric layer is deposited on the first dielectric layer in FIG. 4 to form a first dielectric layer with a bilayer configuration according to an embodiment of the present disclosure.

Referring to FIG. 5, a second deposition step is performed and involves reactive species 25 during the formation of an upper layer 12-2 on a lower layer 12-1 to form a bilayer stack for the first dielectric layer 12. The second deposition step may comprise the same PVD RF sputtering conditions as in the first deposition involving reactive species 24. In some embodiments, a BX layer is deposited on a B layer, a GeX layer is deposited on a Ge layer, or a D layer is deposited on a B, BX, Ge, or GeX layer during the second deposition step according to the second embodiment of the present disclosure.

Figure 6:
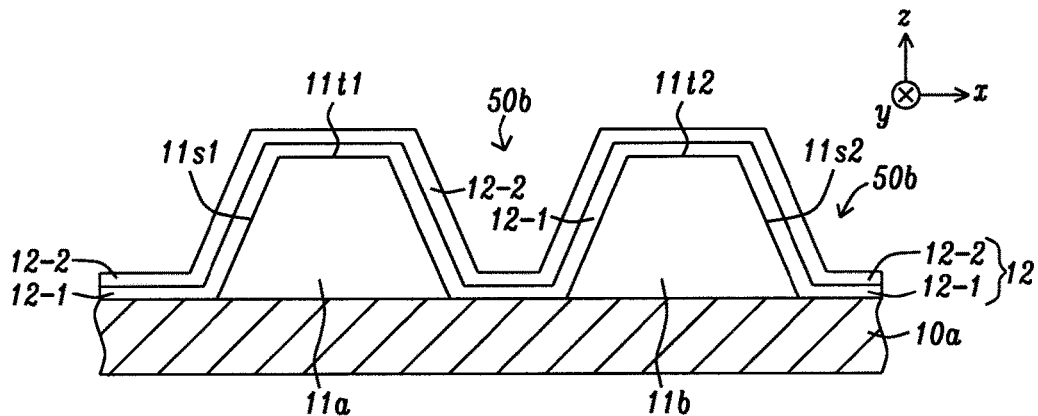

In FIG. 6, the upper layer 12-2 is shown on an upper surface of the lower layer 12-1 as a product of the second deposition step. Here, first dielectric layer 12 in FIG. 1 comprises the bilayer stack 12-1/12-2. Openings 50b are formed above the upper layer, and between adjacent p-MTJs 11a, 11b.

Figure 8:
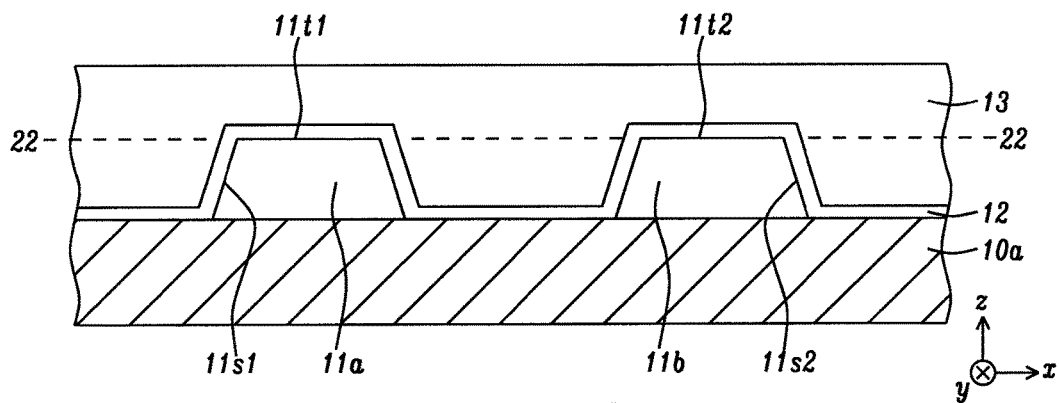
FIG. 8 is a cross-sectional view that depicts a second dielectric layer formed on a first dielectric layer to provide an encapsulation layer according to an embodiment of the present disclosure.

According the third embodiment depicted in FIG. 7, a third deposition step using the previously defined PVD RF sputtering conditions is performed on the intermediate structure in FIG. 6. As a result, another intermediate structure is generated with first dielectric layer 12 having a trilayer configuration wherein an upper layer 12-3 is formed on a bilayer stack 12-1/12-2. For example, the upper layer may be a D layer while 12-1 is B or Ge, and middle layer 12-2 is BX or GeX. According to one embodiment shown in FIG. 8, the second dielectric layer 13 is deposited on first dielectric layer 12 by a PVD, PECVD, or CVD method to fill openings 50a in the FIG. 4 embodiment, or openings 50b in the FIG. 6 embodiment, or openings 50c in the FIG. 7 embodiment. The PVD, PECVD, or CVD method may comprise a temperature in the range of 200° C. to 400° C. to enhance the deposition rate and reduce process time. The second dielectric layer preferably has a minimum thickness h substantially greater than 0 above plane 22-22. The second dielectric layer may be an oxide such as $Al_2O_3$ or $SiO_2$, but other oxides, nitrides, oxynitrides, or carbonitrides may be employed such as one of the D layer materials.

Figure 9:
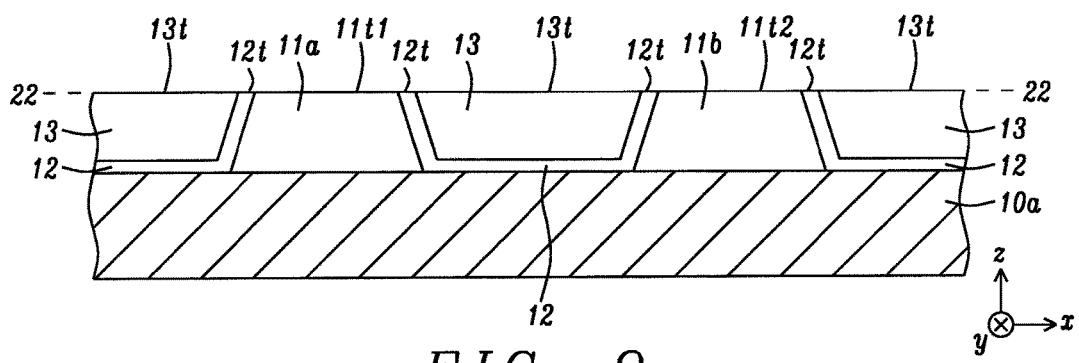
FIG. 9 is a cross-sectional view depicting the partially formed memory structure in FIG. 8 after a chemical mechanical polish process is used to form a planar top surface on the p-MTJs.

In FIG. 9, a well known chemical mechanical polish (CMP) process is performed to remove an upper portion of second dielectric layer 13 such that the partially formed memory device has a top surface along plane 22-22 that includes second dielectric layer top surface 13t, first dielectric layer top surface 12t, and top surfaces 11t1 and 11t2 of p-MTJ 11a and p-MTJ 11b, respectively. Plane 22-22 is parallel to the bottom electrode top surface 10t. In some embodiments, the uppermost p-MTJ layer (not shown) is a hard mask such as MnPt, Ta, TaN, Ti, TiN, or W with a top surface that is 11t1 or 11t2. In other embodiments, the uppermost p-MTJ layer is a capping layer such as Ru, or having a Ru/Ta/Ru configuration, for example.

Returning to FIG. 1, a subsequent sequence of steps well known in the art is followed and includes deposition of insulation layer 15 on plane 22-22 in FIG. 9, and photoresist patterning and etch processes that are used to form a top electrode layer with top electrodes 14a, 14b within the insulation layer. Top electrode 14a adjoins the top surface of p-MTJ 11a, and top electrode 14b contacts the top surface of p-MTJ 11b. As mentioned previously, the top electrode layer typically comprises a plurality of top electrodes formed in an array of parallel lines, for example, but only two top electrodes are shown in the exemplary embodiment. The insulation layer may be silicon oxide or alumina, or other dielectric materials that are used in the art to electrically isolate adjacent conductive lines.

Figure 10:
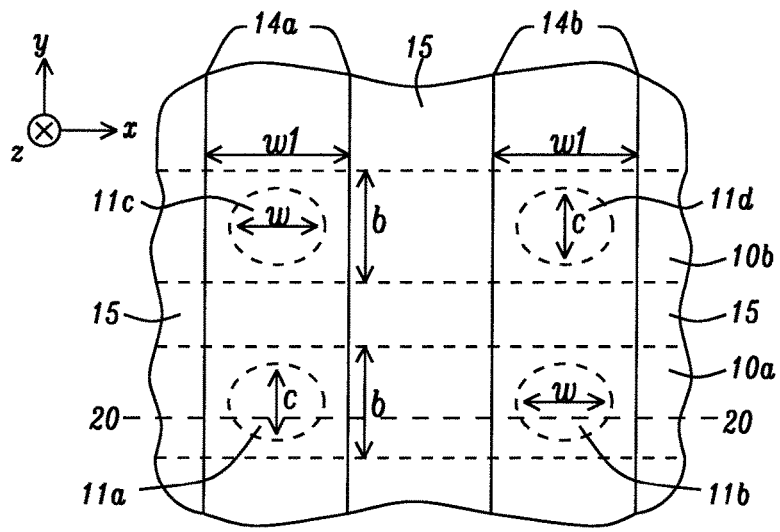
FIG. 10 is a top-down view of a completed MRAM array having a plurality of p-MTJs protected by an encapsulation layer and formed according to an embodiment of the present disclosure.

Referring to FIG. 10, a top-down view of the memory structure in FIG. 1 is depicted. Plane 20-20 indicates the location where the cross-sectional view in FIG. 1 is taken. In the exemplary embodiment where an additional two p-MTJs 11c and 11d are shown between a second bottom electrode 10b and top electrodes 14a, 14b, respectively, the width w1 of the top electrodes is preferably greater than the width w of the p-MTJs 11a-11d. Also a length b of the bottom electrodes 10a, 10b in the y-axis direction is typically greater than the length c of the p-MTJs. The p-MTJs have a substantially circular shape that may be a circle or ellipse. In other embodiments, the p-MTJs may have a polygonal shape such as a square or rectangle.

Figure 11:
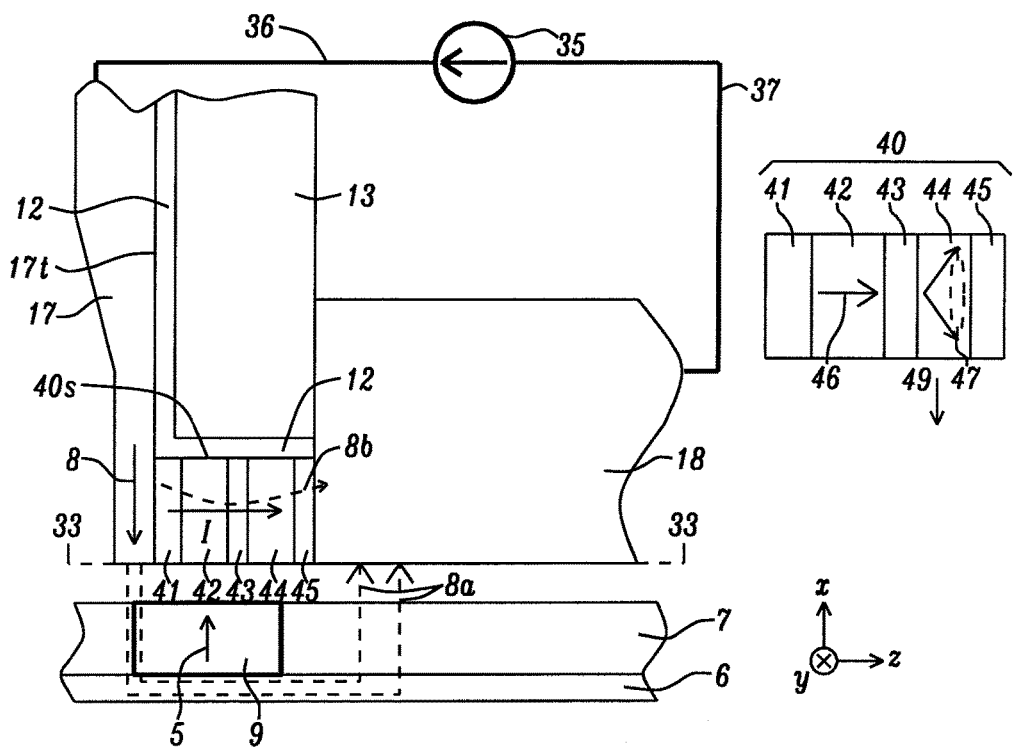
FIG. 11 is a cross-sectional view of a STO device wherein a sidewall is protected by an encapsulation layer formed according to an embodiment of the present disclosure.

In FIG. 11, another embodiment of the present disclosure is shown where the encapsulation layer comprised of dielectric layers 12, 13 described previously may be employed as a protective coating in a STO device. A STO device 40 is formed between a main pole layer 17 and trailing shield 18. In this case, a direct current (100% duty cycle) or pulsed current I flows from a source 35 through lead 36 to main pole 17 and then passes through STO 40 and trailing shield 18 before exiting through lead 37. The pulsed current may be at a scale of 0.1 ns "on" followed by an off period of a fraction of a nanosecond to multiple nanoseconds. The STO 40 may have a bottom spin valve configuration wherein a seed layer 41, spin polarization (SP) layer 42, non-magnetic spacer 43, oscillation layer (OL) 44, and capping layer 45 are sequentially formed on the main pole such that a bottom surface of the seed layer contacts the main pole and a top surface of the capping layer contacts the trailing shield. One or both layers 41, 43 may a metal oxide to induce perpendicular magnetic anisotropy (PMA) 46 in the SP layer. The z-axis is the medium moving direction and is the down-track direction.

During a write process, magnetic flux 8 passes through the ABS 33-33 and transits the magnetic medium 7 and soft underlayer 6 and flux 8a re-enters the write head through trailing shield 18. Under a gap field 8b of several thousand Oe and a dc bias across the STO, the write process is assisted by a spin polarized current passing from the SP layer 42 to the OL 44 with sufficient magnitude (critical current density) to cause a large angle oscillation 47 with a certain amplitude and frequency in the OL that imparts a rf field 49 on medium bit 9. The combined effect of the rf field and magnetic field 8 enables the magnetization 5 in the bit to be switched with a lower magnetic field than when only magnetic field 8 is applied.

The STO device 40 is considered to be a p-MTJ wherein the SP layer 42 serves as a reference layer, the non-magnetic spacer 43 is a tunnel barrier, and OL layer 44 is effectively a free layer. The composition of layers 41-45 is described in detail in related U.S. Pat. No. 9,230,571. A key feature of the present disclosure is that encapsulation layer 12 is formed on a trailing side 17t of the main pole and on a sidewall 40s of STO 40 thereby protecting the sidewall during deposition of insulation layer 13 that is formed between main pole layer 17 and trailing shield 18. As a result, the STO device retains structural integrity during subsequent fabrication steps unlike the prior art where the STO sidewall is susceptible to damage by reactive gases used in the deposition of the dielectric layer.

Figure 12:
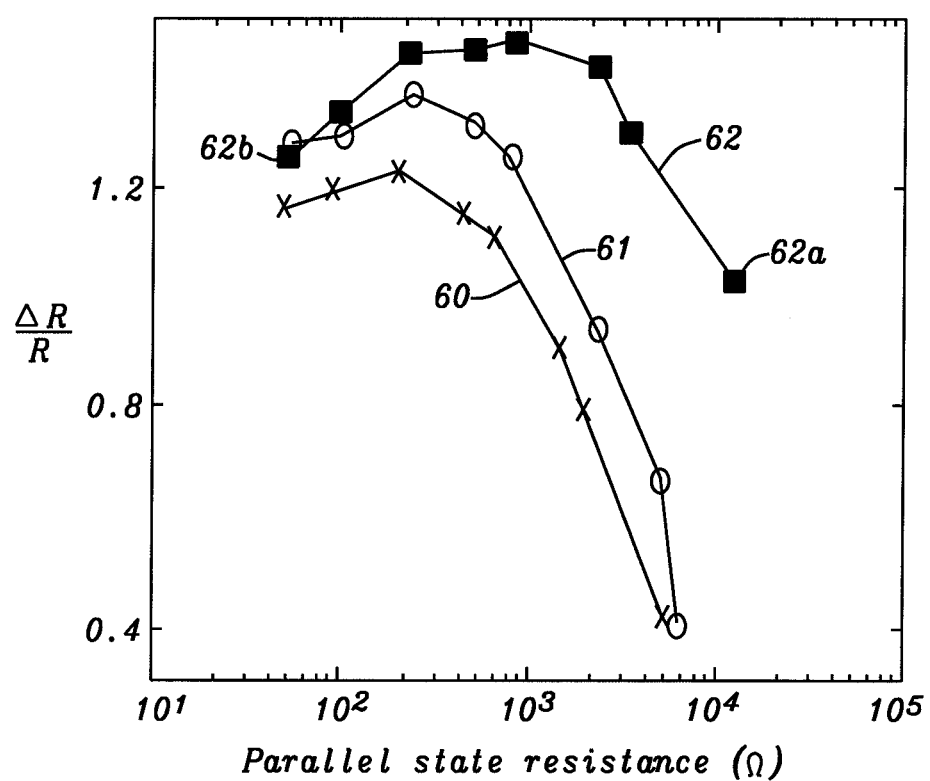
FIG. 12 is a plot of DRR vs. parallel state resistance for p-MTJ devices having an encapsulation layer formed according to prior art methods and by a method according to an embodiment of the present disclosure.

Referring to FIG. 12, an experiment was conducted to demonstrate the improved performance achieved by implementing an encapsulation layer on p-MTJ sidewalls according to an embodiment of the present disclosure. A series of p-MTJs with a CoFeB/MgO/CoFeB reference layer/tunnel barrier/free layer stack was fabricated with a circular shape (w=c in FIG. 10) wherein the diameter w was varied from around 30 nm to 450 nm. The parallel state resistance varied from about $10^2$ ohms for the largest p-MTJ size to approximately $10^4$ ohms for the smallest size. A first set of samples was prepared by depositing a first comparative encapsulation layer on a first group of p-MTJs with a conventional process. The method comprised the deposition of a first $Si_3N_4$ dielectric layer with a thickness of 200 Angstroms using a PECVD process. Thereafter, PECVD was used to deposit a second $Si_3N_4$ dielectric layer with a thickness of 2000 Angstroms on the first $Si_3N_4$ dielectric layer using the same process conditions as the first layer. The results are shown as curve 60.

A second comparative encapsulation layer was deposited on a second group of p-MTJs with another conventional process. In this case, a 200 Angstroms thick $Si_3N_4$ layer was deposited on the p-MTJ sidewalls with a PVD DC sputtering comprised of Ar and $N_2$ plasma. Thereafter, a second $Si_3N_4$ dielectric layer with a thickness of 2000 Angstroms was deposited by the same PECVD process as described above. Results are depicted in curve 61.

A third set of samples was prepared by depositing an encapsulation layer on a third group of p-MTJs according to an embodiment of the present disclosure. In particular, a first dielectric layer with a $Si_3N_4/MgO$(2 weight %) composition and a thickness of 200 Angstroms was PVD RF sputter deposited from a single target by a process comprising RF power, and an Ar flow rate. Thereafter, a second dielectric layer with a $Si_3N_4$ composition and a thickness of 2000 Angstroms was formed by the PECVD process used to deposit the second $Si_3N_4$ layer in the previous two sets of samples. Results are shown in curve 62 where point 62a represents the smallest p-MTJ size, and point 62b is the largest p-MTJ size in the third set of samples. Thus, a plurality of different p-MTJ sizes was fabricated for each of the three sample sets, and an encapsulation layer was formed on each p-MTJ. All samples were annealed at 400° C. for the same period of time.

TMR ratio (dR/R) was measured at 25° C. for each sample with an Accretech UF300A prober. Note that DRR on the y-axis in FIG. 12 is shown in terms of AR/R where 0.8 may be alternatively expressed as 80%, 1.2 is equivalent to 120%, and so forth. In general, DRR is substantially increased for each p-MTJ size, especially as the size decreases to 100 nm and below when an encapsulation layer deposited by a PVD RF sputtering method disclosed herein is used to protect the p-MTJ.

While this disclosure has been particularly shown and described with reference to, the preferred embodiment thereof, it will be understood by those skilled in the art that various changes in form and details may be made without departing from the spirit and scope of this disclosure.

We claim:

1. A magnetic device, comprising:
   (a) a plurality of perpendicularly magnetized magnetic tunnel junctions (p-MTJs) each having a sidewall that extends from a top surface to a bottom surface thereof, the bottom surface contacts a bottom electrode and the top surface contacts a top electrode at a first plane that is parallel to the bottom surface;
   (b) an encapsulation layer that adjoins the sidewall from the top surface to the bottom surface of each p-MTJ, and has a top surface at the first plane, the encapsulation layer comprises:
   (1) a first dielectric layer having a lower layer comprised of B or Ge that contacts the p-MTJ sidewall, and an upper layer that is one or more of $SiO_yN_z$, $AlO_yN_z$, $TiO_yN_z$, $SiCYN_z$, or MgO where y+z>0; and (2) a second dielectric layer formed on a top surface of the first dielectric layer, and having a composition that is one of a metal oxide, metal nitride, metal carbide, metal oxynitride, or metal cyanonitride, or combinations thereof.

2. The magnetic device of claim 1 wherein each p-MTJ is part of a MRAM, spin torque (STT) MRAM, e-flash, or a spin torque oscillator (STO) structure.

3. The magnetic device of claim 1 wherein the first dielectric layer has a bilayer configuration with a thickness from about 3 to 400 Angstroms.

4. The magnetic device of claim 1 wherein the lower layer in the first dielectric layer is one of B, BX, Ge, or GeX where X is one of N, O, B, C, Ge, Al, P, Ga, In, Tl, Mg, Hf, Zr, Nb, V, Ti, Cr, Mo, W, Sr, or Zn.

5. The magnetic device of claim 1 wherein the lower layer in the first dielectric is B or Ge, and the first dielectric layer further comprises a middle layer between the lower layer and upper layer, the middle layer has a BX or GeX configuration wherein X is one of N, O, B, C, Ge, Al, P, Ga, In, Tl, Mg, Hf, Zr, Nb, V, Ti, Cr, Mo, W, Sr, or Zn.

6. The magnetic device of claim 5 wherein the first dielectric layer has a thickness from about 3 Angstroms to 400 Angstroms.

7. The magnetic device of claim 1 wherein the second dielectric layer is one of $SiO_YN_Z$, $AlO_YN_Z$, $TiO_YN_Z$, $SiC_YN_Z$, or MgO, or combinations thereof where y+z>0.

8. A magnetic device, comprising:
(a) a plurality of perpendicularly magnetized magnetic tunnel junctions (p-MTJs) each having a sidewall that extends from a top surface to a bottom surface thereof, the bottom surface contacts a bottom electrode and the top surface contacts a top electrode at a first plane that is parallel to the bottom surface;
(b) an encapsulation layer that adjoins the sidewall from the top surface to the bottom surface of each p-MTJ, and has a top surface at the first plane, the encapsulation layer comprises:
(1) a first dielectric layer that is comprised of 0.1 to 10 weight % of a metal oxide in a metal nitride matrix; and
(2) a second dielectric layer formed on a top surface of the first dielectric layer, and having a composition that is one of a metal oxide, metal nitride, metal carbide, metal oxynitride, or metal cyanonitride, or combinations thereof.

9. The magnetic device of claim 8 wherein each p-MTJ is part of a MRAM, spin torque (STT)-MRAM, or a spin torque oscillator (STO) structure.

10. The magnetic device of claim 8 wherein the first dielectric layer is comprised of MgO formed in a silicon nitride matrix.

11. The magnetic device of claim 8 wherein the first dielectric layer has a thickness from about 3 to 400 Angstroms.

12. The magnetic device of claim 8 wherein the second dielectric layer is one of $SiO_YN_Z$, $AlO_YN_Z$, $TiO_YN_Z$, $SiC_YN_Z$, or MgO, or combinations thereof where y+z>0.

13. A method of forming a magnetic device, comprising:
(a) providing a plurality of perpendicularly magnetized magnetic tunnel junctions (p-MTJs) that are separated by openings on a top surface of a substrate wherein each p-MTJ has a sidewall that extends from a top surface thereof to the substrate top surface, each p-MTJ top surface is at a first plane;
(b) depositing a first dielectric layer on each p-MTJ sidewall by using a physical vapor deposition (PVD) process comprising RF sputtering; and
(c) depositing a second dielectric layer directly on the first dielectric layer, the second dielectric layer fills the openings between the p-MTJ.

14. The method of claim 13 further comprised of:
(a) performing a chemical mechanical polish (CMP) process to form a top surface on the second dielectric layer that is coplanar with the top surface on each of the plurality of p-MTJs; and
(b) performing an anneal process at a temperature of about 400° C.

15. The method of claim 13 wherein the substrate is a bottom electrode in a MRAM or spin torque MRAM, or is a main pole layer in a spin torque oscillator.

16. The method of claim 13 wherein the first dielectric layer has a thickness from about 3 to 400 Angstroms.

17. The method of claim 13 wherein the first dielectric layer is B, Ge, BX, or GeX where X one of N, O, B, C, Ge, Si, Al, P, Ga, In, Tl, Mg, Hf, Zr, Nb, V, Ti, Cr, Mo, W, Sr, and Zn.

18. The method of claim 13 wherein PVD RF sputtering the first dielectric layer comprises a first PVD RF sputtering step to deposit a lower layer that is one of B, BX, Ge, or GeX where X one of N, O, B, C, Ge, Si, Al, P, Ga, In, Tl, Mg, Hf, Zr, Nb, V, Ti, Cr, Mo, W, Sr, and Zn, and then performing a second PVD RF sputtering step to deposit an upper layer on the lower layer where the upper layer is $SiO_YN_Z$, $AlO_YN_Z$, $TiO_YN_Z$, $SiC_YN_Z$, or MgO, or combinations thereof where y+z>0.

19. The method of claim 13 wherein PVD RF sputtering the first dielectric layer comprises a first PVD RF sputtering step to deposit a lower layer that is B or Ge, a second PVD RF sputtering step to deposit a middle layer of BX or GeX where X one of N, O, B, C, Ge, Si, Al, P, Ga, In, Tl, Mg, Hf, Zr, Nb, V, Ti, Cr, Mo, W, Sr, and Zn, and a third PVD RF sputtering step to deposit an upper layer on the middle layer where the upper layer is $SiO_YN_Z$, $AlO_YN_Z$, $TiO_YN_Z$, $SiC_YN_Z$, or MgO, or combinations thereof where y+z>0.

20. The method of claim 13 wherein the second dielectric layer is deposited by a chemical vapor deposition (CVD), physical vapor deposition (PVD), or plasma enhanced CVD (PECVD) process.

21. The method of claim 13 wherein the PVD RF sputter deposition comprises a RF power of 300 to 1500 Watts, an inert gas pressure between 0.05 and 20 mTorr, and an inert gas that is one of Ar, Kr, Xe, and Ne.

22. The method of claim 13 wherein the first dielectric layer is $SiO_YN_Z$, $AlO_YN_Z$, $TiO_YN_Z$, $SiC_YN_Z$, or MgO, or combinations thereof where y+z>0, and the second dielectric layer is a metal oxide, metal nitride, metal carbide, metal oxynitride, or metal cyanonitride, or combinations thereof.

23. The method of claim 22 wherein the first dielectric layer is comprised of a metal oxide that is formed in a metal nitride matrix.

24. The method of claim 23 wherein the first dielectric layer has composition that comprises from 0.1 to 10 weight % of MgO in a silicon nitride matrix.

* * * * *